United States Patent Office 3,703,373
Patented Nov. 21, 1972

3,703,373

PROCESSES AND ELEMENTS FOR PREPARATION OF PHOTOMECHANICAL IMAGES

Michael John Alsup and Alfredo Ruben Guevara, Rochester, N.Y., assignors to Eastman Kodak Company, Rochester, N.Y.

No Drawing. Filed June 15, 1970, Ser. No. 46,525
Int. Cl. G03c *11/12*
U.S. Cl. 96—28 21 Claims

ABSTRACT OF THE DISCLOSURE

A dry process for the preparation of photomechanical images is described which employs as the photosensitive material a plasticized light sensitive polymer.

This invention relates to the preparation of photomechanical images. In a particular aspect it relates to elements and processes for preparing photoresists by processes involving uniform or imagewise transfer of a light sensitive polymer.

It is known in the photographic art to reproduce images by processes which involve imagewise exposure of a layer of a light sensitive polymer, the physical properties of which are differentially modified by the action of radiation, followed by treatment of the layer to remove portions of it in accordance with its exposure to light. Such processes have been employed to prepare lithographic printing plates, stencils, photoresists, and similar photomechanical images.

The art has long recognized the need to transfer layers of such light sensitive polymer compositions from one support to another, and over the years many attempts have been made to work out practicable processes both for the transfer of entire layers of such materials as well as for the imagewise transfer of selected areas of such materials from a temporary support to a second support. The transfer of a complete layer is desirable because it permits the in-plant coating of uniform, heavy layers while avoiding many of the difficulties encountered with on-site preparation of such layers. Problems with solvent evaporation, uniformity, and coating thickness are much more easily controlled during manufacture than they can be locally. Similarly, the imagewise transfer of areas of the layer making use of photothermographic properties of the light sensitive polymer coating permits the preparation of polymer images in desired patterns by simple convenient means which avoids the solvent development step generally employed in the preparation of photomechanical images.

It is an object of this invention to provide novel processes for the preparation of photomechanical images.

It is another object of this invention to provide novel processes for the preparation of photomechanical images which involve the uniform transfer of layers of light sensitive polymer.

It is yet another object of this invention to provide novel, dry processes for the preparation of photomechanical images by the imagewise transfer of light sensitive polymer layers which avoid the use of solvents to develop an image.

It is a further object of this invention to provide novel photosensitive elements containing light sensitive polymer layers which are useful in the processes of this invention.

The above and other objects of this invention will become apparent to those skilled in the art from the further description of the invention which follows.

This invention provides novel processes for the preparation of photomechanical images employing novel photosensitive elements containing a layer of a plasticized light sensitive polymer composition, the light sensitive polymer having appended to the polymer backbone unsaturated cyclic groups or ethylenically unsaturated groups conjugated to each other through an arylene group. The processes of this invention include the steps of (1) adhering to a receptor surface, by the application of heat and pressure, the unexposed portion of a layer of a plasticized light sensitive polymer composition which is carried on a strippable support to which the unexposed polymer composition adheres with less force than it adheres to the receptor surface, (2) cooling the polymer composition and (3) removing the strippable support from the unexposed polymer composition to leave unexposed photosensitive polymer composition on the receptor surface.

The plasticized photosensitive polymer composition can be exposed to an imagewise pattern of actinic radiation at several points in the process with varying results. It can be exposed while it is on the strippable support and prior to its being adhered to the receptor surface; in which case, after adhering the layer, cooling and removing the strippable support, an imagewise distribution of the unexposed polymer composition remains on the receptor surface while the exposed polymer composition stays with the strippable support. This is a positive working process since the relief image remaining on the receptor surface corresponds to the areas of greatest density, i.e., the image areas of the transparency to which the layer was exposed. Alternatively the polymer composition can be exposed subsequent to its being adhered to the receptor surface resulting in a negative working process. Whether imagewise exposure precedes removal of the strippable support or follows removal of the strippable support, a uniform layer of the polymer composition remains on the receptor surface and an image can be obtained by standard techniques such as solvent development.

Hence, both positive and negative working processes can be utilized to prepare photomechanical images in accordance with the present invention. These processes have in common the steps of adhering the layer of the unexposed plasticized light sensitive polymer composition to the receptor surface using heat and pressure, cooling the layer and removing the strippable support from the layer.

The plasticized polymer composition is adhered to the receptor surface by bringing the surface of the unexposed layer, carried on the strippable support, in contact with the receptor surface and applying heat and pressure. This causes unexposed polymer composition to adhere to the receptor surface with greater force than it adheres to the strippable support. Good results are obtained when the layer is heated to a temperature in the range of 80° to 150° C. with a pressure of 16 to 80 pounds per square inch.

A highly useful procedure for applying heat and pressure is by passing the sandwich formed by the strippable support, the layer of the plasticized polymer composition and the receptor surface through one or more pair of rollers. Such rollers can comprise one metal roll, such as an aluminum or stainless steel roll, and one resilient roll, such as a rubber roll having a steel core. The light sensitive polymer layer can be heated just prior to its passing through the rollers or the entire sandwich can be heated by means of heated rollers. The rollers can be heated internally, externally or by a combination of both. Pressure can be applied to the sandwich as it passes through the nip of the rollers. If heating is by means of rollers two sets of rollers can be utilized, one to provide the heat and the second to apply pressure to the heated sandwich, or both heat and pressure can be applied by a single pair of rollers. Pressure can be applied by spring loading the rollers at their ends. Useful results are obtained when force is applied at a rate of 4 to 30 pounds of force per linear inch of roller length. Suitable equipment for adhering the plasticized polymer layer to the receptor surface is described, for example, in Dulmage et al. in U.S. Patent 3,260,612 and Light et al. U.S. Patent 3,261,023.

The light sensitive polymer layer should be allowed to cool to room temperature (i.e. 25 to 30° C.) before the strippable support is removed. If the support is removed prior to the light sensitive polymer layer cooling sufficiently, it has been found that portions of the unexposed polymer composition are often removed with the strippable support, thus resulting in non-uniform coatings or discontinuities in the image areas. In removing the strippable support, best results are generally obtained if the strippable support is removed at an acute angle relative to the sandwich; almost folded back upon itself. Since the strippable support is generally a flexible sheet of film and the receptor surface is generally a relatively rigid sheet of metal, this procedure not only gives the best results, but is the easiest to effect.

As indicated previously, the plasticized polymer composition can be imagewise exposed prior to its being adhered to the receptor surface, it can be exposed after being adhered to the receptor surface but prior to removal of the strippable support or it can be exposed after removal of the strippable support. Exposure is generally to a source rich in ultraviolet radiation although visible light sources can also be employed. Exposure times of from several seconds to several minutes or longer are satisfactory. The most suitable exposure conditions will vary depending upon the particular light sensitive polymer employed, the sensitizers used, if any, the thickness of the light sensitive layer, the image to which the light sensitive layer is being exposed, whether the light sensitive layer is exposed through the strippable support or on its face, etc. Those skilled in the art can readily determine the optimum exposure taking into account such factors as those mentioned above.

If the layer of the plasticized polymer composition is imagewise exposed to actinic radiation prior to laminating it to the receptor surface, after it is laminated it adheres to the strippable support in exposed areas with greater force than it adheres to the receptor surface, while the composition in unexposed areas adheres to the receptor surface with greater force than it adheres to the strippable support. If the layer has not been given any exposure, it adheres uniformly with greater force to the receptor surface than it adheres to the strippable support.

Upon removal of the strippable support, and, as indicated above, depending upon when the light sensitive polymer layer is exposed, there is obtained either an imagewise distribution or a uniform distribution of the polymer composition on the receptor surface. The uniform distribution of polymer composition either will comprise hardened exposed areas alternating with non-exposed, light sensitive areas, if the layer has been exposed prior to stripping, or, if the layer has not been exposed, the light sensitive polymer composition will be uniformly distributed on the receptor surface.

The imagewise distribution of polymer composition is still light sensitive and it can be further imagewise exposed if desired, for example, after the imagewise distribution is used as an etching resist, selected areas can be imagewise exposed and developed to allow further operations to be performed on the receptor surface. If this type of operation is to be carried out the imagewise distribution of light sensitive polymer must be protected from insolubilizing radiation.

Where after stripping there is a uniform distribution of unexposed polymer composition on the receptor surface, an image is formed by imagewise exposure, followed by standard development techniques such as solvent washout of the polymer composition in unexposed areas with a solvent therefor which is a nonsolvent for the polymer in exposed areas.

The light sensitive polymers which are useful in the present invention are those which are capable of being efficiently sensitized and which have appended to a polymer backbone as the light sensitive moiety either unsaturated cyclic groups such as three to six membered carbocyclic rings containing an ethylenic double bond or ethylenically unsaturated groups conjugated to each other through an arylene group.

One such group of light sensitive polymers, in which the unsaturated cyclic groups are three to six membered carbocyclic rings containing an ethylenic double bond are described in De Boer U.S. patent application Ser. No. 831,242, filed June 6, 1969. These light sensitive polymers can be prepared by condensing a carboxylic acid derivative of the unsaturated cyclic group with a preformed polymer backbone containing groups reactive therewith, such as hydroxy groups and amino groups. The unsaturated cyclic group may be joined to the polymer backbone through a carbonyl group, for example, through a carbonyloxy linkage, an oxycarbonyl linkage or an amido linkage.

The cyclic groups which are contained in this group of polymers include derivatives of such unsaturated three to six membered carbocyclic compounds as aryl and diarylcyclopropenes, alkyl and dialkylcyclopropenes, aryl and diarylcyclobutenes, alkyl and dialkylcyclobutenes, aryl and diarylcyclopentenes, alkyl and dialkylcyclopentenes, aryl and diaryl cyclohexenes, alkyl and dialkylcyclohexenes, and the like.

The polymers which form the backbone of the polymers and to which light sensitive moieties are appended include natural and synthetic resins such as free hydroxyl containing polymers, for example, poly(vinyl alcohol), poly(vinyl alcohol-co-vinyl acetate), poly(vinyl alcohol-co-vinyl benzoate), poly(vinyl alcohol-co-vinyl acetate-co-vinyl benzoate), polyethers such as epoxy and phenoxy polymers, e.g., the condensation product of diphenylolpropane with epichlorohydrin, thermoplastic phenolic resins such as novolac resins, e.g., phenol formaldehyde and cresol formaldehyde novolac resins; naturally occurring material such as cellulose, starch, guar, alginic acid, and their partially esterified or esterified derivatives, polyesters of polyhydroxy intermediates such as glycerol and sorbitol which have free hydroxyl groups remaining after incorporation in the polymer chain; polymers containing reactive amino groups such as aminostyrene, and anthranilic acid polymers such as poly(vinyl anthranilate).

The light sensitive polymers of this group have repeating units which can be depicted by the following structural formula:

I

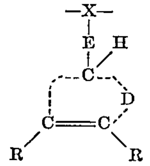

where X represents the residue of a polymer backbone; E is a linkage such as a carbonyloxy linkage, an oxycarbonyl linkage, an amido linkage, and the like; D represents the non-metallic atoms necessary to complete a three to six membered carbocyclic ring such as a cyclopropene ring, a cyclobutene ring, a cyclopentene ring or a cyclohexene ring; and each R is a hydrogen atom, an alkyl group of 1 to 12 carbon atoms (e.g., methyl, ethyl, propyl, butyl, amyl, hexyl, nonyl, decyl, dodecyl, etc.), or an aryl group having one or two rings, such as phenyl or a naphthyl group which is unsubstituted or substituted with one or more of such groups as hydroxy groups, halogen groups (e.g., chloro and bromo groups), carbonyl groups, cyano groups, alkyl groups of 1 to 12 carbon atoms, alkoxy groups of 1 to 12 carbon atoms, and the like.

An especially preferred group of light sensitive polymers for use in the present invention and described in the above-mentioned De Boer U.S. patent application Ser. No. 831,242 are those which are obtained by esterifying a hydroxyl containing polymer with a 1,2-diarylcyclopropene-3-carbonyl chloride and which contain repeating units represented by the following structural formula:

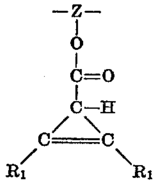

wherein Z represents the polymeric residue of a hydroxyl containing polymer; and each $R_1$ is an aryl group such as a phenyl group, a substituted phenyl group, a naphthyl group, a substituted naphthyl group, etc. A preferred hydroxyl containing polymer is the phenoxy resin formed by the condensation of epichlorohydrin with diphenylolpropane.

Another group of light sensitive polymers which contain as the light sensitive moiety, a side chain containing two ethylenically unsaturated groups conjugated to each other through an arylene group, are described in Reynolds et al. U.S. patent application Ser. No. 3,536, filed Jan. 16, 1970, for "Light Sensitive Polymers." These light sensitive polymers can be prepared by reacting a suitable compound containing the light sensitive moiety with an appropriate polymer backbone. This compound should have one group which is reactive with a group on the polymer backbone and through which it can be attached to the polymer backbone. If the compound containing the light sensitive moiety has more than one such group, the polymer backbone is likely to be crosslinked during the preparation thus destroying its utility in photosensitive compositions. Thus, one of the ethylenically unsaturated groups is attached to the polymer backbone through the residue of a group which is reactive with a group on the polymer backbone and the other of the ethylenically unsaturated groups is terminated with groups which are nonreactive with the groups on the polymer backbone.

Typically, these light sensitive polymers can be prepared by condensing a carboxylic acid or carboxylic acid halide containing the light sensitive moiety with a preformed polymer containing groups reactive therewith, such as free reactive amino groups or hydroxyl groups, in which case the light sensitive moiety is attached to the polymer backbone through an amido linkage or a carbonyloxy linkage. Another procedure for preparing these light sensitive polymers involves reacting a hydroxyl-containing derivative of the light sensitive moiety with a polymer containing groups reactive therewith, such as free reactive amino groups or hydroxyl groups, in which case the light sensitive moiety is attached to the polymer backbone through an amido linkage or a carbonyloxy linkage. Another procedure for preparing these light sensitive polymers involves reacting a hydroxyl-containing derivative of the light sensitive moiety with a polymer containing groups reactive therewith, such as free reactive anhydride groups, carboxylic acid groups or carboxylic acid halide groups, in which case the light sensitive moiety is attached to the polymer backbone through an oxycarbonyl linkage.

Representative reactants which can be employed to attach the light sensitive side chain to the polymer include:

p-vinylcinnamoyl chlorides such as p-vinylcinnamoyl chloride,
p-(2-nitrovinyl)cinnamoyl chloride,
p-(2-propylvinyl)cinnamoyl chloride,
p-(2-phenylvinyl)cinnamoyl chloride,
p-[2-(p-nitrophenyl)vinyl]cinnamoyl chloride,
p-(2,2-diethylvinyl)cinnamoyl chloride,
p-(2-amyloxyvinyl)cinnamoyl chloride,
p-(2-ethoxyvinyl)cinnamoyl chloride,
p-[2-(2-ethylhexyloxy)vinyl]cinnamoyl chloride,
p-(2-propoxy 2-cyanovinyl)cinnamoyl chloride,
p-(2-naphthoxyvinyl)cinnamoyl chloride,
p-(2-methylcarbonylvinyl)cinnamoyl chloride,
p-(2-ethylcarbonylvinyl)cinnamoyl chloride,
p-(2-ethyl-2-benzoylvinyl)cinnamoyl chloride,
p-[2-butyl-2-(p-methoxybenzoyl)vinyl]cinnamoyl chloride,
p-(2-ethoxycarbonylvinyl)cinnamoyl chloride,
p-[2-(2-ethylhexyloxycarbonyl)vinyl]cinnamoyl chloride,
p-(2-hexyloxycarbonylvinyl)cinnamoyl chloride,
p-(2-ethyl-2-ethoxycarbonylvinyl)cinnamoyl chloride,
p-(2-vinyl-2-ethoxycarbonylvinyl)cinnamoyl chloride,
p-(2-allyl-2-propoxycarbonylvinyl)cinnamoyl chloride,
p-(2-ethoxycarbonyl-2-cyanovinyl)cinnamoyl chloride,
p-[2-(2-ethylhexyloxycarbonyl)-2-cyanovinyl]cinnamoyl chloride,
p-(2-allyloxycarbonylvinyl)cinnamoyl chloride,
p-(2-vinyl-2-allyloxycarbonylvinyl)cinnamoyl chloride,
p-(2-phenoxycarbonylvinyl)cinnamoyl chloride, etc.; and 4-vinylchalcones such as 4-(2-chlorocarbonylvinyl)chalcone,
4-(2-chlorocarbonylvinyl)-4′-methoxychalcone,
4-(2-chlorocarbonylvinyl)-4′-amyloxychalcone,
4-(2-chlorocarbonylvinyl)-4′-(2-ethylhexyloxy)chalcone,
4-(2-chlorocarbonylvinyl)-4′-propylchalcone,
4-(2-chlorocarbonylvinyl)-4′-octylchalcone,
4-(2-chlorocarbonylvinyl)-4′-dimethylaminochalcone,
4-(2-ethoxycarbonylvinyl)-4′-(2-hydroxyethoxy) chalcone, etc.;

as well as such reactants as 2-styryl-5-(2-chlorocarbonylvinyl)furan,
2-(2-amyloxyvinyl)-5-(2-chlorocarbonylvinyl)furan,
2-[2-(p-methoxyphenyl)vinyl]-5-(2-chlorocarbonylvinyl)furan,
2-[2-(2-ethylhexyl)vinyl]-5-(2-chlorocarbonylvinyl) thiofuran,
2-(2-ethoxycarbonylvinyl)-6-(2-chlorocarbonylvinyl) pyridine, and the like.

The light sensitive moieties can be appended to a polymer backbone derived from natural or synthetic resins such as hydroxyl containing polymers, for example, poly(vinyl alcohol), partially hydrolyzed poly(vinyl esters) such as poly(vinyl alcohol-co-vinyl acetate), poly(vinyl alcohol-co-vinylbenzoate), poly(vinylalcohol-co-vinyl acetate-co-vinyl benzoate), partially hydrolyzed poly(vinyl acetals) such as partially hydrolyzed poly(vinyl butyral), partially hydrolyzed poly(vinyl benzal), partially hydrolyzed poly(vinyl cinnamal) as well as mixtures of such partially hydrolyzed acetals, polyethers such as epoxy and phenoxy polymers, e.g., the condensation product of a bisphenol, such as diphenylolpropane, with epichlorohydrin, naturally occurring materials such as cellulose, starch, guar, alginic acid, and their partially esterified or etherified derivatives, e.g., ethyl cellulose, hydroxyethyl cellulose, hydroxypropyl cellulose, polyesters of polyhydroxy intermediates such as glycerol and sorbitol which have hydroxyl groups remaining after incorporation in the polymer chain, etc.; polymers containing reactive amino groups, for example, poly(vinyl amines), aminostyrenes, poly(vinyl anthranilates), etc., and polymers containing reactive anhydride groups, for example, copolymers of maleic anhydride with ethylene or styrene.

These light sensitive polymers, which are described in the aforementioned Reynolds et al. Ser. No. 3,536 have repeating units which can be represented by the following structural formula:

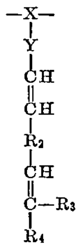

wherein X represents the residue of a polymer backbone, Y is an oxycarbonyl linkage, a carbonyloxy linkage, an amido linkage, or the like; $R_2$ is an arylene group such as a mono- or polynuclear arylene group of the benzene series, e.g., phenylene, naphthylene, biphenylene, chlorophenylene nitrophenylene, etc., or a 5- or 6-membered heterocyclic arylene group containing such hetero atoms as oxygen, sulfur, nitrogen, etc., pyridylene, furylene, thiofurylene, thienylene, 1-alkyl-2-pyrrolylene, etc., preferably $R_2$ is a phenylene group. $R_3$ and $R_4$ are so selected that they will not react with groups on the polymer backbone to which the light sensitive moiety is attached. Thus, where the compound containing the light sensitive moiety is bifunctional, such as a dicarboxylic acid, one of the functional groups is blocked so as to prevent cross-linking of the polymer backbone. Thus, $R_3$ is hydrogen, cyano, alkyl generally having 1 to 10 carbon atoms, e.g., methyl, ethyl, propyl, isopropyl, butyl, sec-butyl, t-butyl, n-amyl, neopentyl, n-hexyl, n-heptyl, n-octyl 2-ethylhexyl, etc., alkenyl generally having 2 to 6 carbon atoms, e.g., vinyl, allyl, etc., and the like; and $R_4$ is hydrogen, nitro or a monovalent organic group non-reactive with the groups on the polymer backbone such as alkyl generally having 1 to 10 carbon atoms alkenyl generally having 2 to 6 carbon atoms, aryl, e.g., phenyl, naphthyl, biphenyl, furyl, pyridyl, etc., alkoxy generally having 1 to 10 carbon atoms, e.g., methoxy, ethoxy, propoxy, butoxy, amyloxy, hexyloxy, heptyloxy, etc., aryloxy, e.g., phenoxy, furyloxy, etc., alkylcarbonyl generally having 2 to 11 carbon atoms, e.g., methyl carbonyl, ethylcarbonyl, propylcarbonyl, butylcarbonyl, amylcarbonyl, hexylcarbonyl, octylcarbonyl, 2-ethylhexylcarbonyl, etc., arylcarbonyl, e.g., benzoyl, naphthoyl, etc., alkoxycarbonyl generally having 2 to 11 carbon atoms, e.g., methoxycarbonyl, ethoxycarbonyl, propoxycarbonyl, butoxycarbonyl, amyloxycarbonyl, hexyloxycarbonyl, heptyloxycarbonyl, octyloxycarbonyl, nonyloxycarbonyl, etc., alkenyloxycarbonyl generally having 3 to 7 carbon atoms, e.g., allyloxycarbonyl, methacryloylcarbonyl, etc., aryloxycarbonyl, e.g., phenoxycarbonyl, and the like, said aryloxycarbonyl, arylcarbonyl, aryloxy, and aryl groups being optionally substituted, particularly in the para-position, with such groups as nitro, azido, alkyl generally having 1 to 10 carbon atoms, alkoxy generally having 1 to 10 carbon atoms, dialkylamino, diarylamino and the like groups.

As previously mentioned, the two groups of light sensitive polymers employed in the present invention can be prepared by reaction of the hydroxy or amino group on the polymer backbone with an acyl halide of the light sensitive moiety or by reaction of a hydroxy containing derivative of the light sensitive moiety with a polymer containing reactive anhydride, carboxylic acid or carboxylic acid halide groups. This reaction may be carried out, for example, in a tertiary amine solvent such as pyridine, picoline, lutidine, triethylamine, and the like, at room temperature, or at elevated temperatures up to about 100° C.

A highly useful procedure for preparing light sensitive polymers is described in copending Reynolds U.S. patent application Ser. No. 812,380 entitled "A Process for the Preparation of Soluble Polyvinyl Esters," filed Apr. 1, 1969. This procedure involves swelling a hydroxyl containing polymer in pyridine followed by partial esterification with an aroyl chloride such as benzoyl chloride. The light sensitive acid chloride is then reacted with the mixture and finally the esterification of any remaining hydroxyl groups is completed with an additional amount of aroyl chloride.

In addition to the groups containing the light sensitive moiety, the polymers may have attached to the polymer backbone groups that are derived from other carboxylic and dicarboxylic acids. Such other groups are often used in modifying such physical properties of the polymer as solubility, adhesivity, melting point, ink receptivity, resistance to chemical etchants, and the like, and in some instances can modify the sensitometric properties of the polymer as well. Useful groups include those derived from aliphatic and aromatic carboxylic acid, such as acetic acid, haloacetic acid, propionic acid, butyric acid, isovaleric acid, succinic acid, glutaric acid, adipic acid, sebacic acid, 2-ethylhexanoic acid, decanoic acid, benzoic acid, halobenzoic acids, nitrobenzoic acids, toluic acids, p-ethylbenzoic acid, p-octylbenzoic acid, p-methoxybenzoic acid, p-ethoxybenzoic acid, p-amyloxybenzoic acid, p-lauryloxybenzoic acid, 2-naphthoic acid, and the like. These modifying side chains can be introduced into the polymer by reacting it with an acyl halide of the modifying group, and it can be attached to the polymer prior to the addition of the light sensitive group, for example, when an acetylated poly(vinyl alcohol) is used as the polymer backbone, or when the procedure of the Reynolds U.S. application Ser. No. 812,380, referred to above, is employed to prepare the light sensitive polymers of this invention, Alternatively, free reactive groups, which are contained on the polymer backbone after addition of the light sensitive moiety, can be reacted with an acyl halide, or other suitable reactant, of these modifying groups. The modifying side chains can comprise up to 95% of the groups attached to the polymer backbone. Thus, as few as 5% of the groups attached to the polymer backbone can be light sensitive groups of the present invention. In general, it is preferred that 5 to 50% of the groups attached to the polymer backbone are light sensitive groups of this invention, although this will vary depending upon the nature of the polymer forming the backbone, its molecular weight, and similar factors.

The light sensitive polymers employed in the present invention generally do not of themselves have the proper thermomechanical properties for thermal transfer to metal supports. Suitable thermal transfer characteristics are provided by addition of one or more plasticizers to the polymer composition. This has the effect of lowering the glass transition temperature and softening temperature of the polymer so as to permit transfer of the unexposed polymer composition, yet does not have an adverse effect on the resistance of the polymer composition to acidic or basic etchants of the type generally utilized in the preparation of photo-mechanical images.

Suitable plasticizers which can be used to modify the thermo-mechanical properties of the polymers and the polymer compositions employed in the present invention include chlorinated polyphenyls such as chlorinated biphenyls, triphenyls and the like; esters such as triphenyl phosphate, butylphthalate, phenylphthalate, etc., sulfonamide plasticizers such as N-cyclohexyl-p-toluene-sulfonamide, polymeric plasticizers such as polyvinyl esters, e.g. polyvinyl methyl ether, and the like. Suitable plasticizers are available commercially under such trade names as Arochlor, Santicizer, Gantrez and the like.

The amount of plasticizer employed in the polymer composition will vary depending upon such factors as the particular plasticizer employed, the particular light sensitive polymer employed, the presence of other components in the light sensitive composition, the ultimate use to which the light sensitive element is to be put, and the like. The optimum amount of plasticizer can be readily determined by those skilled in the art taking the above factors into consideration. Generally, satisfactory results are obtained when the plasticizer is present in amount of between about 25 and 200 percent by weight based on the weight of the light sensitive polymer in the composition.

If too much plasticizer is added to the light sensitive polymer composition, it has been found that an unduly tacky layer results. This tackiness can be eliminated and yet good transfer of the polymer composition to relatively thick supports can be obtained if, instead of a single plasticizer, a combination of plasticizers is employed. A suitable combination comprises a chlorinated polyphenyl plasticizer of the type referred to above and a low melting crystalline plasticizer such as one of the ester plasticizers described above. The use of the combination of plasticizers produces useful coatings which provide excellent transfer to thick copper-clad receptor surfaces without requiring the use of disadvantageously high transfer temperatures of excessive amounts of plasticizer. The plasticizer combinations do not have any adverse effect on the polymer formulations and yield easily handled flexible coatings.

Although the light sensitive polymers are sufficiently light sensitive to be useful without additional sensitization, it is preferred to increase their photosensitivity by adding suitable sensitizers thereto.

Suitable sensitizers for this purpose include, for example, pyrylium and thiapyrylium salts [e.g., 2,6-bis(p-ethoxyphenyl) - 4 - (p-amyloxyphenyl)thiapyrylium perchlorate], thiazoles, benzothiazolines, naphthothiazolines (e.g., 2 - benzoylmethylene-3-ethylnaphtho[1,2-d]-thiazoline), quinolizone, Michler's ketone, Michler's thioketone, benzophenone, furanones, anthraquinones, 2,6-bis-p-azidobenzal-4-methylcyclohexanone and the like sensitizers. Pyrylium and thiapyrylium salts are especially preferred sensitizers for the purposes of the present invention. Such salts include, for example:

2,4,6-triphenylpyrylium perchlorate,
4-(4-methoxyphenyl)-2,6-diphenylpyrylium perchlorate,
4-(2,4-dichlorophenyl)-2,6-diphenylpyrylium perchlorate,
4-(3,4-dichlorophenyl)-2,6-diphenylpyrylium perchlorate,
2,6-bis(4-methoxyphenyl)-4-phenylpyrylium perchlorate,
6-(4-methoxyphenyl)-2,4-diphenylpyrylium perchlorate,
2-(3,4-dichlorophenyl)-4-(4-methoxyphenyl)-6-phenylpyrylium perchlorate,
4-(4-amyloxyphenyl)-2,6-bis(4-ethylphenyl)pyrylium perchlorate.

Suitable pyrylium and thiapyrylium salts in addition to the foregoing are disclosed in U.S. Patent No. 3,250,615 to Van Allan et al., which is hereby incorporated by reference. Suitable concentrations of the sensitizer include between about 0.005 and about 5 weight percent of the polymer, preferably between about 0.005 and about 0.1 weight percent.

Coating compositions for use in this invention can be prepared by dispersing or dissolving the polymer and the sensitizing agent in an organic solvent such as aromatic solvents, for example, benzene, xylene, toluene, benzyl alcohol, etc.; alkanols, such as ethanol, isopropanol, 2-methoxyethanol, etc.; ketones such as acetone, 2-butanone, 4-methyl-2-pentanone, cyclohexanone, etc.; chlorinated hydrocarbon solvents such as chloroform, carbon tetrachloride, trichloroethylene, dichloroethane, trichloroethane, tetrachloroethane, etc.; dimethylformamide; mixtures of these solvents, and the like. A preferred solvent is ethylene chloride.

A variety of addenda can be incorporated in the coating compositions. These include agents to modify physical properties of the coating such as flexibility, adhesivity, surface characteristics, as well antioxidants, preservatives, and the like. Non-light sensitive polymers can also be added to the coating compositions to serve as diluents or extenders. Solid particles, such as glass microbead having an average diameter of 1 to 10$\mu$, are preferred as extenders since they increase the bulk and porosity of the coating without absorbing incident radiation.

Antioxidants are a preferred class of addenda, particularly when a combination of plasticizers is employed. It has been found that the addition of a mild reducing agent, or antioxidant, reduces scumming in unexposed areas of printing plates prepared according to this invention. Suitable antioxidants include propyl gallate, hydroquinone, phloroglucinol, resorcinol, thiourea, and the like, as well as those described in Smith et al. U.S. Pat. 2,691,584, issued Oct. 12, 1954.

The plasticized light sensitive polymer layer can be coated onto the strippable support by solvent techniques in accordance with usual practice or by coating from the melt. Dry coating thicknesses of between about 0.1 and 2 mils are suitable for most purposes.

The strippable support should be selected so that the unexposed polymer composition adheres to it with less force than to the receptor surface. Useful supports are those to which the unexposed polymer composition adheres with low to moderate force. Such materials can be selected from fiber based materials such as paper, polymer coated paper such as polyethylene coated paper, polypropylene coated paper, and the like, synthetic polymeric film-forming materials such as polyalkylmethacrylates, e.g. poly(methylmethacrylate), polyester film base, e.g., poly(ethylene terephthalate), polyvinyl acetals, polyamides, e.g., nylon polyolefins such as polyethylene, polypropylene, etc. and the like. Of course, the choice of a specific strippable support will depend, to a certain extent, upon the receptor surface with which the light sensitive layer is to be used. A particularly preferred strippable support for use with metallic receptor surfaces is poly(ethylene terephthalate).

In one embodiment of this invention the polyethylene terephthalate strippable support is unsubbed polyethylene terephthalate. In another embodiment of this invention the preferred polyethylene terephthalate strippable support has a sub coating of a swellable, electrically insulating polymeric material which adheres to the strippable support. Useful sub-coating materials include polyesters having both aromatic and aliphatic constituents such as those formed with both aromatic and aliphatic dibasic acids, for example a polyester of ethylene glycol and terephthalic and sebacic acids; polyvinyl acetals such as those produced by hydrolyzation of polyvinyl acetate followed by acetalization with formaldehyde or acetaldehyde, for example polyvinyl formal; hydrosol terpolymers, which are three component addition type co-polymers prepared by aqueous emulsion co-polymerization, containing vinylidene chloride as a major constituent, such as a terpolymer of methyl acrylate, vinylidene chloride and itaconic acid as disclosed in U.S. Pat. No. 3,143,421. Other useful materials would also include the so-called tergels which are the subject matter of co-pending Nadeau et al. U.S. application Ser. No. 597,669, filed Nov. 29, 1966.

When a sub coating is employed on the polyethylene terephthalate support, it is often desirable to interpose between the subcoating and the light sensitive polymer layer a release layer. The preferred release layer comprises a polymer which has a slow rate of recrystallization after heating. Suitable such polymers include the light sensitive polyesters and copolyesters described in U.S. Pat. 3,030,208 and Allen U.S. application Ser. No. 709,-496 filed Feb. 29, 1968, as well as the non-light sensitive polymers, described in U.S. Pat. 3,342,623. This release layer can be coated on the subbed polyethylene terephathalate support by procedures similar to that employed to coat the layer of the light sensitive polymer composition on the strippable support. Preferably the release layer is applied to the support at a rate of 0.08 to 0.2 gram per square foot of support.

As indicated above the release layer can be coated on the subbed strippable support by conventional solvent coating techniques. However, it has been found that if the light sensitive polymer composition is then coated onto the release layer intermixing of the light sensitive layer and the release layer occurs making it difficult to effect successful transfer of the light sensitive layer from the strippable support to the receptor surface. This intermixing can be avoided by preparing the element in special ways.

One procedure involves coating the light sensitive polymer composition on a temporary support, which can be an unsubbed poly(ethylene terephthalate) support or another flexible polymer layer, and then laminating the layer of the light sensitive polymer composition to the release layer carried on the strippable support. The conditions of lamination and the equipment used can be the same as employed to adhere the layer of the light sensitive polymer composition to the receptor surface. This procedure can be employed when the release layer is prepared either from a light sensitive polyester or from a non-light sensitive polyester.

An alternative procedure, which can be employed when the release layer is prepared from a light sensitive polymer, involves giving the light sensitive release layer an overall flash exposure sufficient to harden just the surface of the release layer, and then coating the light sensitive polymer composition over the release layer by standard solvent coating techniques. The flash exposure renders the release layer resistant to the coating solvents employed for the plasticized light sensitive polymer composition and hence prevents intermixing of the two layers. This latter procedure permits in-line coating of the element on the strippable support.

The following examples are included for a further understanding of the invention:

EXAMPLE 1

Positive-working image transfer

A coating composition is prepared by dissolving in 37.8 grams of ethylene chloride, 2.0 grams of the light-sensitive polymer, poly[4,4' - isopropylidenediphenyl 2-(1,2 - diphenylcyclopropenyl - 3 - carbonyloxy)trimethylene ether], prepared as described in Example 7 of De Boer U.S. Ser. No. 831,242 filed June 6, 1969, 2.0 grams of a chlorinated biphenyl plasticizer (Arochlor 1254 sold by Monsanto Chemical Company) and 0.2 gram of the sensitizer 3 - ethyl - 2 - benzoylmethylenenaphtho[1,2-d] thiazoline. This dope is coated at a wet thickness of 0.008 inch on a poly(ethylene terephthalate) film support subbed with a terpolymer of 79% vinylidene chloride, 15% acrylonitrile and 6% acrylic acid. The resulting element is then exposed through a positive transparency to a 4000 watt pulsed Xenon lamp for about 30 seconds. The element is then contacted with a 2 mil copper foil and passed between heated transfer rolls of the type described in Dulmage et al. U.S. Pat. 3,760,612 which are set at a temperature of 104° C. and a pressure of 50 pounds per square inch. The non-exposed areas of the coating are transferred to the foil. The foil is then etched in the non-protected areas with a hot ferric chloride bath. The transferred polymer image adheres to the copper foil and is unaffected by the hot ferric chloride solution.

EXAMPLE 2

Layer transfer

A coating composition is prepared by dissolving 10.0 grams of the light-sensitive polymer used in Example 1, 5.0 grams of the chlorinated biphenyl plasticizer and 0.01 gram of 2,6 - bis - p-ethoxyphenyl-4-p-n-amyloxyphenylthiapyrylium perchlorate in 60 grams of ethylene chloride. The composition is then coated to give a dry thickness of 1.0–1.5 mil on unsubbed polyethylene terephthalate film supports. Samples of the dried coatings are then laminated to both copper and aluminum foils by means of heated pressure rolls at a temperature of 100° C. and approximately 30 lbs./linear inch pressure. After cooling for 5 to 10 seconds the film base is stripped, leaving the polymer layer on the foil. Samples are then exposed to a 4000 watt pulsed xenon lamp through a negative transparency and developed by dissolving the non-exposed polymer in 1,1,1-trichloroethane solvent. The resulting image is then used as an etching resist as described in Example 1.

EXAMPLE 3

Modification of sensitizer concentration

Example 2 is repeated except that 1% sensitizer, based on the weight of polymer, is used. Considerably sharper images are developed since the higher dye concentration reduces the effect of undercutting from light reflected by the metal.

EXAMPLE 4

Comparison of two development methods

Example 2 is repeated up to the development step. Development in a commercial vapor degreaser using trichloroethylene is compared to development by means of ultrasonic agitation of 1,1,1-trichloroethane. A Sonogen 150 watt ultrasonic generator equipped with a Sonogen-Z 25 kc. Transducer tank is used. The 1,1,1-trichloroethane in the transducer tank is heated to 60° C. and development is completed in 30–40 seconds. Results showed considerably sharper images using ultrasonic agitation.

EXAMPLE 5

Example 3 is repeated except the polymer used is poly {4,4' - isopropylidenediphenyl p - [β-(2-ethylhexyloxycarbonyl)vinyl]cinnamoyloxy}trimethylene ether prepared as described in Example 13 of Reynolds et al. U.S. Ser. No. 3,536 filed Jan. 16, 1970. Photographic speed, resist characteristics and development properties are comparable to those obtained in Example 3.

EXAMPLE 6

Example 3 is repeated except that the polymer used is polyvinyl-(12 mole percent acetate, 36.4 mole percent benzoate, 21 mole percent diphenylcyclopropene carboxylate, 30.6 mole percent alcohol). The sensitizer dye is 3-ethyl-2-benzoylmethylenenaphtho[1,2-d]thiazoline at 1% concentration based on the weight of the polymer. The plasticizer concentration is 50% based on the weight of the polymer. A 1.5 mil layer transferred to an aluminum substrate showed excellent development in the vapor degreaser and excellent resist properties.

EXAMPLE 7

Release layer

A poly{vinyl p-[2-(2-ethylhexyloxy carbonyl)vinyl]-cinnamate-co-vinyl butyral}polymer prepared as described in Example 24 of Reynolds et al. U.S. Ser. No. 3,536 filed Jan. 16, 1970, is used to prepare a resist matrix as follows. A coating composition based on the pentamethylene-(bis-p-phenylene diacrylate-coazelate) (37.5/62.5) copolyester and containing 0.5% by weight of the sensitizer 2-(benzoylmethylene)-3-ethylnaphtho[1,2-d]thiazoline is machine-coated on a subbed poly(ethyleneterephthalate) film support at a dry coverage of 140 milligrams per square foot. A sample of this coating is exposed through a photographic step tablet to a 4000 watt pulsed xenon light source for 64 integrated incident exposure units (about 2 minutes) on a Nu Arc Flip-Top Exposing Unit. This constitutes a pre-exposed release layer which is then coated to give a dry thickness of 0.7 mils with a coating composition based on the polyvinyl butyral named above and containing 5% by weight of the sensitizer 2,6 bis p-ethoxyphenyl - 4 - p-n-amyloxyphenyl thiapyrylium perchlorate. The resulting element is exposed through a positive transparency for 200 units on the Nu Arc unit, and is then pressure-laminated to a grained aluminum plate at a temperature of 110° C. and a pressure of 50 pounds per square inch after which it is allowed to cool at room temperature for one minute. The film support is then stripped off, resulting in an excellent positive image of the original transparency on the aluminum plate.

EXAMPLE 8

Lithographic printing plate

A polymer image on an aluminum plate prepared as described in Example 7 is affixed to a small lithographic press. The polymer areas are evenly and heavily inked; no ink is accepted by the grained aluminum surfaces. This plate is used to prepare approximately one hundred prints.

EXAMPLE 9

Modification of plasticizer concentration

The following seven formulations are made, based on the polymer of Example 1. All of these formulations contained .015 gram of the sensitizer, 2-benzoyl methylene-3-ethylnaphtho[1,2-d]thiazoline.

(A)

| | G. |
|---|---|
| Polymer | 3.0 |
| Arochlor 1254 | 1.8 |
| Phthalo Blue-Greenish Pigment (B4790, Harmon Colors Inc.) | 0.0075 |

(B)

| | |
|---|---|
| Polymer | 3.0 |
| Arochlor 1254 | 2.4 |
| Phthalo Blue-Greenish Pigment | 0.0075 |

(C)

| | |
|---|---|
| Polymer | 3.0 |
| Arochlor 1254 | 3.0 |
| Phthalo Blue-Greenish Pigment | 0.0075 |

(D)

| | |
|---|---|
| Polymer | 3.0 |
| Arochlor 1254 | 3.6 |
| Phthalo Blue-Greenish Pigment | 0.0075 |

(E)

| | |
|---|---|
| Polymer | 3.0 |
| Arochlor 1254 | 4.2 |
| Phthalo Blue-Greenish Pigment | 0.0075 |

(F)

| | |
|---|---|
| Polymer | 3.0 |
| Arochlor 1254 | 4.8 |
| Phthalo Blue-Greenish Pigment | 0.0075 |

(G)

| | |
|---|---|
| Polymer | 3.0 |
| Arochlor 1254 | 5.4 |
| Phthalo Blue-Greenish Pigment | 0.0075 |

These compositions are coated at a wet thickness of 0.008 inch coated (to give a dry coverage of 1.0 mil) on poly(ethylene terephthalate) support and dried. Each of the resulting elements is then laminated to a thick copper-clad fiber circuit board placed on the heated platen (approx. 100° C.) of a Vandercook press by rolling the impression cylinder of the press over the platen at approximately 30 lbs./linear inch pressure. After cooling for 5 to 10 seconds the poly(ethylene terephthalate) film base is stripped, leaving the polymer layer on the copper board. The samples are then exposed to a 4000 watt pulsed xenon lamp through a negative transparency and developed by dissolving the non-exposed polymer in 1,1,1-trichloroethane solvent. The exposed copper surfaces are then treated with hot ferric chloride solution. It is observed that as the concentration of the single plasticizer is increased, the transfer temperature could be lowered. However, transfer temperatures low enough to be practical cannot be obtained without producing a disadvantageously high level of tackiness, making the element extremely difficult to handle.

EXAMPLE 10

Two plasticizers

The following three formulations based on the polymer of Example 5 are made, coated and processed as described in Example 9. These formulations all contained .015 gram of the sensitizer used in Example 9 and .0125 gram of the Phthalo Blue Greenish Pigment.

(A)

| | G. |
|---|---|
| Polymer | 5.0 |
| Arochlor 1254 | 2.0 |
| Diphenyl phthalate | 2.0 |

(B)

| | |
|---|---|
| Polymer A | 5.0 |
| Arochlor 1254 | 1.2 |
| Diphenyl phthalate | 1.2 |

(C)

| | |
|---|---|
| Polymer A | 5.0 |
| Arochlor 1254 | 0.9 |
| Diphenyl phthalate | 0.9 |

All of these coatings are free from tackiness and readily produce transfer images to thick copper-clad boards.

EXAMPLE 11

Two plasticizers

A coating composition having the following formulation is prepared:

| | G. |
|---|---|
| Polymer of Example 1 | 75.0 |
| Chlorinated biphenyl plasticizer (Arochlor 1254 sold by Monsanto) | 37.5 |
| N-cyclohexyl paratoluene sulfonamide plasticizer (Santicizer 1H sold by Monsanto) | 37.5 |
| Ethylene chloride | 600.0 |
| Phthalo Blue-Greenish Pigment | 1.5 |
| (2 - benzoyl methylene - 3 - ethyl naphtho[1,2-d] thiazoline) | 0.75 |

This formulation is coated to give a dry thickness of 1.0 mil on a poly(ethylene-terephthalate) film support and dried. The dried sample is then placed in a 90° C. oven and cured for 30 minutes. After curing, the coating is heat laminated to a scrubbed copper support using the equipment of Example 1 and then the temporary poly(ethylene terephthalate) is stripped off. The element is exposed to a 4000 watt xenon source through a negative line transparency and through a 0.3 log $E$ step tablet in a Nu Arc Flip Top Platemaker. After exposure the sample is returned to the 90° C. oven for 4 to 5 minutes and then developed by spraying with 2-methoxy ethyl acetate. This sample does not exhibit a residual polymer scum in the background areas.

EXAMPLE 12

Addition of antioxidant

A coating composition having the same formulation as Example 11 is prepared, except that the polymer of Example 5 is used. This formulation is split into two parts. Part A is a control. To Part B is added 0.25 g. of propyl gallate. When coated and tested as described in Example 11, Part A (without propyl gallate) exhibits the presence of a considerable amount of residual polymer scum in the background areas after development. Part B (with the propyl gallate) does not exhibit any residual scum after development.

The invention has been described in detail with particular reference to preferred embodiments thereof, but it will be understood that variations and modifications can be effected within the spirit and scope of the invention.

What is claimed is:

1. A process for preparing a photomechanical image which includes the steps of (a) adhering to a receptor surface, by the application of heat and pressure, the unexposed portion of a layer of a plasticized light-sensitive polymer composition carried on a strippable support, the light-sensitive polymer having appended to a polymer backbone light-sensitive groups selected from the class consisting of light sensitive groups having a three to six membered carbocyclic ring containing an ethylenic double bond and light sensitive groups containing two ethylenically unsaturated groups conjugated to each other through an arylene group, the unexposed polymer composition adhering to the strippable support with less force than it adheres to the receptor surface, (b) cooling the polymer composition, and (c) removing the strippable support from the unexposed polymer composition to leave unexposed photosensitive polymer composition on the receptor surface.

2. A process as defined in claim 1 further comprising the step of exposing the light sensitive polymer composition to an imagewise pattern of actinic radiation.

3. A process as defined in claim 2 wherein exposure precedes removing the strippable support.

4. A process as defined in claim 2 wherein exposure is subsequent to removing the strippable support.

5. A process as defined in claim 2 wherein exposure precedes adhering the polymer composition to the receptor surface.

6. A process as defined in claim 1 wherein, after removing the strippable support, the unexposed polymer composition constitutes a continuous layer carried on the receptor surface.

7. A process as defined in claim 1 wherein, prior to being adhered to the receptor surface, the unexposed polymer composition forms a continuous layer with, and is complementary to, adjacent areas of imagewise exposed, photoinsolubilized polymer composition.

8. A process as defined in claim 1 wherein adhering tthe unexposed polymer composition to the receptor surface is accomplished by contacting the polymer composition with the receptor surface and passing the sandwich thus formed through heated pressure rollers.

9. A process as defined in claim 8 wherein adhering of the unexposed light-sensitive polymer composition to the receptor surface is accomplished at a temperature of between about 80 and 150° C. and a pressure of 16 to 80 pounds per square inch.

10. A process as defined in claim 1 wherein the backbone of the light-sensitive polymer is derived from a hydroxy containing polymer selected from the group consisting of polyvinyl alcohol, partially hydrolyzed polyvinyl acetals and the polyether condensation product of a bisphenol with epichlorohydrin.

11. A process as defined in claim 10 wherein the appended light-sensitive groups are derived from a 1,2-diarylcyclopropene-3-carbonyl chloride.

12. A process as defined in claim 11 wherein the light-sensitive polymer is poly[4,4'-isopropylidenediphenyl 2-(1,2 - diphenylcyclopropenyl - 3 - carbonyloxy)trimethylene ether].

13. A process as defined in claim 10 wherein the appended light-sensitive groups are derived from a p-vinylcinnamoyl chloride.

14. A process as defined in claim 13 wherein the polymer is poly{4,4'-isopropylidenediphenyl p-[β-(2-ethylhexyloxycarbonyl) - vinyl]cinnamoyloxy}trimethylene ether.

15. A process as defined in claim 13 wherein the light-sensitive polymer is poly{vinyl p-[2-(2-ethylhexyloxycarbonyl)vinyl]cinnamate-co-vinyl butyral}.

16. A process as defined in claim 1 wherein the layer of light-sensitive polymer is plasticized with a chlorinated polyphenyl plasticizer.

17. A process as defined in claim 16 wherein the plasticizer is present in the composition in amount of between about 25 and 200 percent by weight based on the weight of the light-sensitive polymer.

18. A process as defined in claim 1 wherein the light-sensitive polymer layer further comprises a sensitizer selected from the group consisting of pyrylium salts, thiapyrylium salts and naphthothiazoline sensitizers.

19. A process as defined in claim 1 wherein the layer off the light-sensitive polymer composition has a thickness of between about 0.1 and 2 mils.

20. A process as defined in claim 1 wherein the strippable support is a sheet of polyethylene terephthalate.

21. A process as defined in claim 1 wherein the receptor surface is a metallic sheet.

References Cited

UNITED STATES PATENTS

| | | | |
|---|---|---|---|
| 3,100,702 | 8/1963 | Rauner et al. | 96—33 |
| 3,526,504 | 9/1970 | Celeste et al. | 96—35.1 |
| 2,956,878 | 10/1960 | Michiels | 96—33 |
| 3,526,504 | 9/1970 | Celeste | 96—35.1 |
| 3,060,023 | 10/1962 | Burg | 96—35.1 |
| 3,556,792 | 1/1971 | Katz | 96—35.1 |

FOREIGN PATENTS

| | | |
|---|---|---|
| 1,128,850 | 10/1968 | England. |

J. TRAVIS BROWN, Primary Examiner

J. L. GOODROW, Assistant Examiner